(12) United States Patent
Pesala

(10) Patent No.: US 9,442,227 B2
(45) Date of Patent: Sep. 13, 2016

(54) PLANAR SOLAR CONCENTRATORS USING SUBWAVELENGTH GRATINGS

(75) Inventor: Bala Pesala, Chennai (IN)

(73) Assignee: Council of Scientific & Industrial Research, New Delhi (IN)

(*) Notice: Subject to any disclaimer, the term of this patent is extended or adjusted under 35 U.S.C. 154(b) by 187 days.

(21) Appl. No.: 14/130,823

(22) PCT Filed: Jul. 5, 2012

(86) PCT No.: PCT/IN2012/000476
§ 371 (c)(1),
(2), (4) Date: Mar. 25, 2014

(87) PCT Pub. No.: WO2013/005231
PCT Pub. Date: Jan. 10, 2013

(65) Prior Publication Data
US 2014/0198380 A1   Jul. 17, 2014

(30) Foreign Application Priority Data
Jul. 5, 2011   (IN) .......................... 1887/DEL/2011

(51) Int. Cl.
*G02B 5/18*     (2006.01)
*H01L 31/054*   (2014.01)
*H01L 31/0216*  (2014.01)

(52) U.S. Cl.
CPC .......... *G02B 5/1809* (2013.01); *G02B 5/1814* (2013.01); *H01L 31/02168* (2013.01); *H01L 31/0543* (2014.12); *H01L 31/0549* (2014.12); *Y02E 10/52* (2013.01)

(58) Field of Classification Search
CPC ........ G02B 5/02; G02B 5/0252; G02B 5/18; G02B 5/1804; G02B 5/1809; G02B 27/42; G02B 27/4233; G02B 27/4272; G02B 27/4277; G02B 5/008; G02B 5/1814; H01L 31/00; H01L 31/02168; H01L 31/0232; H01L 31/02325; H01L 31/02327; H01L 31/0543; H01L 31/0547; H01L 31/0549; Y02E 10/52
See application file for complete search history.

(56) References Cited

U.S. PATENT DOCUMENTS

| | | |
|---|---|---|
| 2010/0259826 A1 | 10/2010 | Ji et al. |
| 2010/0288352 A1 | 11/2010 | Ji et al. |
| 2011/0083739 A1 | 4/2011 | Peng et al. |

FOREIGN PATENT DOCUMENTS

WO   WO-2006/078319   7/2006

OTHER PUBLICATIONS

Kostuk et al., "Analysis and Design of Holographic Solar Concentrators," Proc. of SPIE, vol. 7043, 2008, pp. 704301-1 thorugh 704301-8.*

*Primary Examiner* — Stephone B Allen
*Assistant Examiner* — Adam W Booher
(74) *Attorney, Agent, or Firm* — Blank Rome LLP; Michael C. Greenbaum

(57) ABSTRACT

Light concentration of order more than 10 times using sub-wavelength diffraction gratings integrated on top and bottom surface of a planar glass substrate is claimed. The invention discloses designing of subwavelength gratings, with period less than the wavelength of light, which can effectively guide the incoming solar radiation into the glass substrate. The subwavelength gratings so designed eliminate long wavelength IR light with energy below the band gap of solar cell completely thus reducing the heating of the solar cell and eliminating the extra cooling requirement (size) thus increasing the efficacy. The subwavelength gratings integrated on top of low cost planar glass substrates and can be used for solar photovoltaic and other applications for heating/cooling purposes.

10 Claims, 8 Drawing Sheets

PLANAR SOLAR CONCENTRATORS USING SUBWAVELENGTH GRATINGS

This application is a U.S. national phase of International Application No. PCT/IN2012/000476, filed Jul. 5, 2012, which claims the priority of Indian Patent Application No. 1887/DEL/2011, filed Jul. 5, 2011, the disclosures of which are incorporated herein by reference.

FIELD OF INVENTION

The present invention relates generally to light concentrators. More particularly, the present invention relates to light concentrators for solar photovoltaic applications. The light concentrators proposed here can also be used for producing concentrated thermal and light energy. Light concentrators find application in variety of areas including concentrated solar photovoltaics, concentrated solar power, day lighting applications, fuel production systems, spectrum splitters, thermo photovoltaic applications and other secondary utilization's of optical energy.

BACKGROUND OF THE INVENTION

Ground level solar energy radiation is so dilute that devices which concentrate sunlight are utilized before converting it to electrical or thermal energy useful for a wide range of applications. These devices typically use geometric optics in the form of mirrors and lenses. In doing so there are cost issues and the requirement of tracking. Optics with high concentration capabilities need to be tracked or be directed towards the sun on an hourly basis while even moderate concentration devices require seasonal adjustments to cope with seasonal changes.

Traditional solar energy conversion is achieved by flat plate technology, in which solar radiation directly impinges upon a large array of photovoltaic cells typically made of high purity Silicon. Conventional photovoltaic cells are formed from monocrystalline, polycrystalline, amorphous silicon. Because the cost of photovoltaic cells and the demand for semiconductor material are both high, the cost of the high volume of semiconductors required for conventional photovoltaic is a deterrent to widespread use. Further, typical efficiencies of the Silicon solar cells are moderate in the range of 15-20%. In contrast, concentrated photovoltaic systems increase the efficiency by converting solar energy to "direct current" electricity by using mirrors/lenses to focus the sunlight onto a high efficiency small and thus much less expensive solar cell. Hence, light concentrators can reduce the cost of electricity generated using solar photovoltaic by reducing the amount of high cost semiconductor material needed for photovoltaic conversion.

In the last three decades, several solar concentrator designs based on geometric and luminescent concentrators have been proposed and developed. Geometric designs are based on reflective, refractive, fibre optic, holographic systems in which light is manipulated/redirected onto a receiver where a photovoltaic (PV) cell converts the light energy into electrical energy. On the other hand, luminescent concentrators typically use absorptive dyes/pigments where the light energy is absorbed and re-emitted at a large (red-shifted) wavelength. This emitted light is then guided in the substrate through total internal reflection towards the edges. A PV cell placed at the edges of the substrate converts the light energy into electrical energy.

Several Luminescent concentrator designs have been proposed and realized. In the late 70's a novel type of collector was extensively investigated consisting of a transparent sheet doped with appropriate organic dyes by W.H. Weber et al Appl. Opt., 15, 2299, (1976). U.S. Ser. No. 12/414,722 disclose a radiation concentrator suitable for use in concentrating solar radiation for efficient and low cost solar photovoltaic use, especially in window-mounted devices. U.S. Pat. No. 4,227,939 propose a new type of solar collector, the Luminescent Solar Concentrator (LSC) based on light-pipe trapping of molecular fluorescence. The main advantage of luminescent concentrator designs compared to the geometric concentrator designs is that they do not need precise tracking. However, luminescent concentrators typically suffer from self-absorption problem, low absorption bandwidth; hence typically a stack of LSC's are required to harness the whole solar spectrum, isotropic emission; only a fraction of light is guided in the substrate and contributes to light concentrations and long term degradation problem especially under high light concentrations. These entire factors give rise to low concentrations (typically close to 10×) compared to the geometric concentrator designs.

U.S. Pat. No. 6,476,312 discloses a radiation concentrator for use with a photo voltaic device. The device uses a distribution of quantum dots instead of organic dyes/pigments in-order to red-shift the incoming radiation. The red-shifted radiation is then internally guided in the waveguide which is converted to electrical energy using a photovoltaic device attached to the end of the waveguide. The advantage of this approach compared to organic dyes/pigments is higher absorption efficiency but this design require a large distribution of quantum dots to minimize the overlap between the emission and the absorption spectrum in which case absorption spectrum also becomes broader. Further, the quantum dots have to pack extremely close to each other to achieve large light collection efficiency. This will result in formation of clusters affecting the desired red shifts and reduction of light concentration efficiency. Further, quantum dots also give isotropic luminescence and hence only a fraction of light is coupled into the guiding substrate.

In geometric concentrator designs, the concentrating optical elements typically have a non-zero focal length making the concentrated photovoltaic modules bulkier than the non-concentrating counterparts. Concentrated photovoltaic systems also need precise tracking to maximize energy conversion efficiency and this bulkiness is disadvantageous not only for tracking but also in terms of handling, shipping and material costs. It is possible to obtain less bulky concentrated photovoltaic cell module while maintaining the same concentration factor by reducing the size of the photovoltaic cell. Also the concentrators typically require a cooling system which further adds to cost, size and inefficiency of the solar photovoltaic system. Many methods/arrangements have been tried to reduce the size and increase the efficiency of the concentrator in the prior art by developing planar concentrator designs.

U.S. Ser. No. 12/231,046 discusses a family of flat concentrator PV panels wherein an array of enhanced light beam splitters coupling with a plurality of optical grooves efficiently collects light and transmits collected light substantially to the active surface(s) of an array of size-reduced PV cells with low aspect ratio. However, the concentrations achieved using these designs are not very high and the performance of the concentrator may suffer at various angles of incidence.

In "High Efficiency Solar Cells Enhanced with Diffraction Grating" by Sin-inchi Mizuno et al., Technical digest of the International PVSEC-11, Sapporo, Hokkaido, Japan, 341 (1999), diffraction gratings are secured onto the front and back surfaces of thin film, single crystal silicon using an adhesive material having refractive index of 2, such that the average light path of thin film silicon was tripled when compared with silicon thin films having a mirror placed on the back surface thereof. As Silicon has low absorption coefficient compared to other semiconductors, these designs are typically employed to increase the absorption length of light in the solar cell there by increasing the efficiency of photovoltaic conversion. These designs are most effective to increase the absorption of light near the band gap energy of the Silicon U.S. Ser. No. 12/113,705 discuss a planar light-guide solar panel for harvesting and trapping the light inside of a dielectric material. The surface of the light-guide solar panel consists of a light-insertion stage where in light is guided into the substrate using parabolic/elliptical reflectors, Winston cone optics, Cassegrain optics etc. To maximize the light guiding into the substrate the profile of the light guiding optics, light insertion points and substrate taper etc. need to be carefully optimized.

However the common problem faced with all of the above designs during reduction in size is the requirement of skilled assembling of primary and secondary mirrors and specialized tooling and the accurate placement of solar cells Components which are designed in such a way to simplify the assembly process would greatly improve the chances of a solar energy system to be successful. Additional considerations such as ease of installation, serviceability and durability against environmental; conditions are also important. Further, due to large light concentrations involved, all the IR light below the band gap of the solar cell goes unutilized in electricity conversion and causes excessive heating of the solar cell and hence these designs typically require active cooling.

OBJECTIVE OF THE INVENTION

The main objective of the present invention is to develop a planar solar concentrator which obviates the drawback of the hitherto known prior art as detailed above.

Another objective of the present invention is to utilize unique steep angle diffraction properties of subwavelength gratings.

Yet another objective of the present invention is to achieve light guiding in the glass substrate in order to realize high concentration (>10 times) at the edges.

Still another object of the invention is to eliminate long wavelength IR light with energy below the band gap of any solar cell completely thus reducing the excessive heating of the solar cell.

Yet another objective of the present invention is to provide a solar concentrator which eliminates the cooling requirements.

Yet another objective of the present invention is to provide a planar solar concentrator which is smaller in size.

Still another objective of the invention is to provide a solar concentrator which is cost effective.

Yet another objective of the present invention is to provide a solar concentrator which is easy in manufacturing all without mitigating the high concentration ratio and overall efficiency.

In this invention the unique properties of sub-wavelength gratings is used to increase the light guiding efficiency in the substrate so that high concentration of light can be realized at the edges. A photovoltaic cell placed at the edge can convert the light energy to electricity. Since the grating is of sub-wavelength nature, reflective diffraction orders contributing to the loss of optical energy are completely eliminated in this design and light is diffracted at steep angles in the substrate. Analytically it can prove that steep angle diffraction in the substrate is critical to realizing large light concentration. Further, inventors have utilized the high-index contrast between the grating ($n_{grating}$=3) and the substrate ($n_{substrate}$=1.5) and optimized the grating thickness and duty cycle (width of the grating w.r.t the period of the grating) to achieve high-diffraction efficiency (>80% over a broad wavelength range) into first order (+1/−1) transmission diffraction orders (diffraction orders with large diffraction angles so that light be guided through total internal reflection). The invention is exceptionally advantageous in the terms that it can achieve large light concentrations while completely eliminating long wavelength IR radiation below the band gap of any solar cell (by appropriate choice of the period) there by significantly reducing the necessity for active cooling of the solar cell. The light concentrator consists of the diffraction gratings as per the parameters (thickness $t_g/\Lambda$=0.27, duty cycle=0.4, refractive index of grating=3, $\Lambda$ being the period of the grating) of the invention may be integrated on the top and/or bottom of the low cost planar glass substrates which are readily available in the market. Other parameters values of the grating will also be possible if one considers binary grating/gratings with other profiles such as rectangular, semi-circular and circular gratings etc.

SUMMARY OF THE INVENTION

Accordingly, the present invention provides an improved method of concentrating light using a solar concentrator the said method comprising the steps of:

(i) integrating sub wavelength gratings on top and bottom surface of a planar glass substrate, wherein the said sub wavelength gratings are optimized for minimizing $0^{th}$ order reflection and transmission (0R, 0T) and maximizing the diffraction of the incoming light into higher transmission orders (+1T, −1T); and (ii) optimizing said sub wavelength gratings for minimizing $0^{th}$ order reflection and transmission (0R, 0T) and maximizing the diffraction of the incoming light into higher transmission orders (+1T, −1T), wherein the concentration of the subwavelength grating is optimized according to formula:

$$C_{max}(\square) \approx \frac{2*r_d}{1-r_{dt}}\tan(\square)$$

Where Cmax is concentration ratio, $r_d$ is the diffraction efficiency of the incoming light into ±1T modes, rat is the diffraction efficiency of +1T mode into −1T mode (and vice versa), diffraction angle θ is given by θ=sin−1(λ/Λ*n substrate) in the limit of large W/t where width "W" and thickness "t" of concentrator.

Another embodiment of the present invention, the sub wavelength gratings are made on a glass substrate by any known methods like nano-imprint lithography, Interference lithography, Focused Ion Beam (FIB) and E-beam lithography Yet another embodiment of the present invention, the period between two sub wavelength gratings is in the range of 0.3 μm to 1.5 μm.

Yet another embodiment of the present invention, the thickness of the subwavelength grating is in the range of 0.1 µm to 5 µm.

Still another embodiment of the present invention, the width of the subwavelength grating is in the range of 0.1 µm to 1.5 µm.

Yet another embodiment of the present invention, the subwavelength grating is selected from the group consisting of rectangular, triangular and semi-circular profile projections.

Still another embodiment of the present invention, the refractive index of the subwavelength grating is in the range of 1.3 to 5.

Yet another embodiment of the present invention, long wavelength IR light of wavelengths $\lambda/\Lambda > 1.5$ are filtered from the incoming light wherein, depending on the solar cell, the period is optimally chosen to satisfy the above condition so that all the IR light below the band gap is filtered.

Still another embodiment of the present invention, the concentration of the incoming light is of order >10 times.

Yet another embodiment of the present invention, the subwavelength grating to be used with solar cells, fiber optic or other light-guide to propagate concentrated.

Yet another embodiment of the present invention, the method of propagating concentrated light to another location for lighting and/or heating applications comprising use of solar concentrator having subwavelength gratings integrated on top and bottom surface of a planar glass substrate.

Still another embodiment of the invention, a solar cell can be placed at the edge of the glass substrate to convert concentrated sunlight into electricity. Large light concentrations achieved can greatly help in reducing the cost of semiconductor material need for solar photovoltaic conversion.

Yet another embodiment of the invention, is a planar light concentrator where in the subwavelength grating is placed on the top and the bottom of the substrate. The top grating is optimized for steep-angle diffraction of large wavelengths where as the bottom grating is optimized for steep angle diffraction of smaller wavelengths.

Still another embodiment of the invention, is a circular subwavelength grating where light is concentrated towards the centre. A bi-facial solar cell can be used to convert the sunlight to electricity.

DETAILED DESCRIPTION OF THE INVENTION

In accordance with the objectives of the invention, the inventor discloses a novel approach of obtaining light concentration using subwavelength gratings integrated on top/bottom of low cost planar glass substrates. Though gratings have been exemplified herein, it is obvious that the invention may be used in other formats known to a person skilled in the art.

Figure 1:
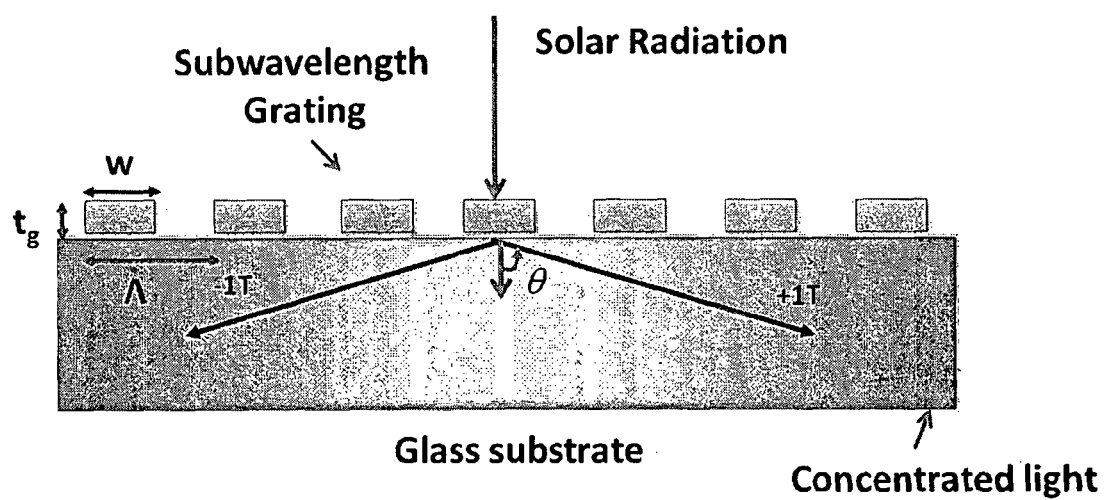
FIG. 1 shows the schematic of grating based planar light concentrators. Incident solar radiation is diffracted into a planar low cost glass substrate at steep angles where it is guided towards the edge creating large light concentration (indicated by the gradient in color).

The key idea of the current approach is to design subwavelength gratings, with period less than the wavelength of light, which can effectively guide the incoming solar radiation into the glass substrate. In this invention the "no diffractive reflection" property of sub-wavelength gratings is utilize thus avoiding any loss of solar energy. In accordance to the invention, the inventors optimally design the subwavelength grating parameters (period, thickness and duty cycle) to minimize both the 0th order reflection and transmission (0R, 0T) and diffract incoming light mainly into first order diffractive transmission orders (+1T, −1T) where they are guided in the substrate. Further, diffractive transmission orders for very large wavelengths are eliminated as the diffraction angle theoretically becomes greater than 90°. Hence, by optimally choosing the period of the grating, long wavelength IR light below the band gap can be completely eliminated in this approach. This light below the band gap of the solar cell doesn't contribute to the photovoltaic conversion and causes excessive heating of the solar cell especially at large concentrations. Hence, the uniqueness of the present design lies in minimizing this long IR radiation significantly there by reducing the active cooling requirements of the solar cells. As shown in FIG. 1, absence of reflective diffraction orders that contributes to loss of solar energy. Further, steep angle diffraction results in effective guiding of light in the glass substrate giving rise to increased concentration of sunlight at the edges (as seen from the high intensity of red color).

As is known diffracted light in general makes several bounces in the glass substrate before reaching the edge. Each such bounce on the grating side results in the loss of energy. For maximal light concentration, a large diffraction angle is desired so that the light encounters fewer bounces before reaching the edge. Using this background knowledge inventor derived an analytical expression based on ray-optics approach to obtain an estimate for the concentration ratio as a function of diffraction angle θ.

Assuming a concentrator of width "W" and thickness "t", the intensity accumulated after each bounce is added as the light reaches the edge. In the limit of large W/t ratio, maximum concentration ratio $C_{max}$ for each polarization can be written as:

$$C_{max}(\theta) \approx \frac{2*r_d}{1-r_{dt}}\tan(\theta) \quad (1)$$

Where $r_d$ is the diffraction efficiency of the incoming light into ±1T modes and $r_{dt}$ is the diffraction efficiency of +1T mode into −1T mode (and vice versa) and diffraction angle θ is given by $\theta=\sin^{-1}(\lambda/\Lambda*n\text{ substrate})$. From the above equation, it's clear that high concentration ratios (>>1) can be achieved for a large angle of diffraction. The inventors have validated certain concentration values based on the above equation complied in table 1:

TABLE 1

Concentration ratio as a function of wavelength for the optimized HCG parameter values of $t_g/\Lambda = 0.27$ and duty cycle w/Λ of 0.4, Λ being the period of the grating and for TE polarized incident light.

| Wavelength (λ/Λ) | Diffraction Angle (θ) | Diffraction Efficiency ($r^d$) | Diffraction Efficiency ($r^{dt}$) | $C^{max}$ |
|---|---|---|---|---|
| 1 | 41.81 | 0.26 | 0.28 | 0.7 |
| 1.1 | 47.17 | 0.36 | 0.21 | 1.0 |
| 1.2 | 53.14 | 0.40 | 0.31 | 1.5 |
| 1.3 | 60.08 | 0.44 | 0.33 | 2.3 |
| 1.4 | 68.97 | 0.43 | 0.38 | 3.6 |
| 1.45 | 75.17 | 0.38 | 0.46 | 5.3 |
| 1.48 | 80.64 | 0.31 | 0.59 | 9.0 |
| 1.49 | 83.39 | 0.25 | 0.68 | 13.1 |
| 1.499 | 87.92 | 0.10 | 0.88 | 44.9 |

From the above table, it can be seen that the concentration values approach 50 can be achieved. Preliminary simulation data has been generate by using Rigorous Coupled-Wave Analysis (RCWA) which is a semi-analytical method in computational electromagnetic that is most typically applied to solve scattering from periodic dielectric structures. It is a Fourier-space method so devices and fields are represented as a sum of spatial harmonics and the scattered field amplitudes are obtained by matching the boundary conditions in electric and magnetic fields at each interface. From this reflection, transmission and diffraction efficiencies are calculated.

Figure 2:
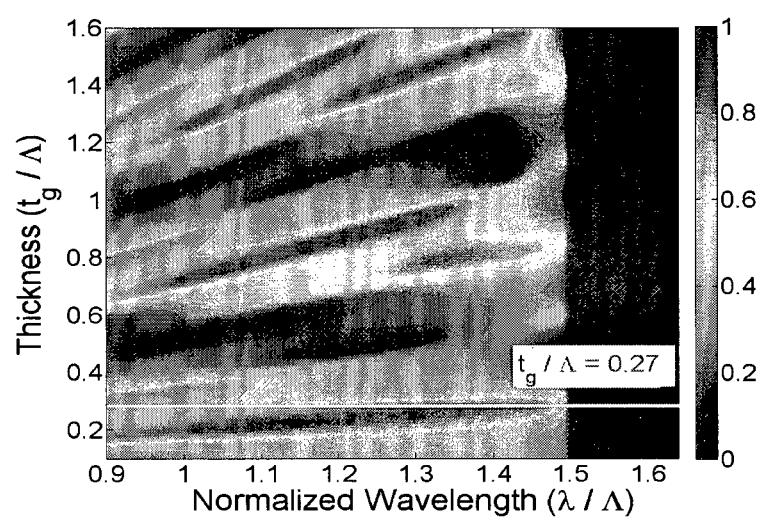
FIG. 2 shows the contour plot of energy diffracted into first order transmission modes ±1T as a function of wavelength and the thickness $t_g$ of the grating for a duty cycle of 0.4.

RCWA results to find an optimized design is depicted in FIG. 2 which is the contour plot of the energy diffracted into ±1T modes for a duty cycle DC of 0.4 and for various thickness values "$t_g$" of the grating further detailed in Example 1. The Finite-difference time-domain (FDTD) which is one of the primary available computational electrodynamics modeling techniques is also used. Since it is a time-domain method, FDTD solutions cover a wide frequency range with a single simulation run, and treat nonlinear device response properties in a natural way as detailed in Example 2.

First, as expected from equation 1, concentration increases steeply as the wavelength increases due to increased diffraction angle. The concentration values obtained from the analytical equation predict the trend and the values obtained from the numerical simulation very well. Multiple peaks are due to excitation of guided modes in the substrate. Smooth variation is expected in future simulations involving large substrate dimensions. For wavelength λ/Λ beyond 1.5, concentration is minimal because the theoretical diffraction angle becomes larger than 900 and hence higher order transmission orders ±1T are not possible. In this case, light energy incident on the grating is either reflected or transmitted through the glass substrate. This cut-off is extremely advantageous since the grating period can be optimally chosen such that λ/Λ>1.5 falls below the band gap of the solar cell. This long wavelength IR radiation which causes excessive heating of the solar cell can be completely eliminated in this approach for example, for a Silicon solar cell, band gap wavelength is roughly 1100 nm. Hence, by choosing the period as 0.67 um, all long wavelength IR radiation above 1000 nm is completely filtered. The sub-wavelength gratings can be fabricated using numerous techniques such as Nano-imprint lithography, interference lithography etc.

It is possible to couple the concentrated light into fibre optic or other light-guide to propagate it to another location for some other use such as lighting and heating applications. Steep angle diffraction of light due to subwavelength gratings also results in increased path length of light in the substrate and hence can be used for efficiency enhancement of thin film solar cells.

The foregoing description of embodiments of the present invention has been prepared for purposes of illustration and description. It is not intended to be exhaustive or to limit the present invention to precise form disclosed, and modifications and variations are possible in light of the above teachings. The embodiments have been chosen to explain the principles of the present invention and should not be construed to be limitation in any form.

EXAMPLES

The following examples are given by way of illustration and therefore should not be construed to limit the scope of the present invention.

Example 1

Figure 6:
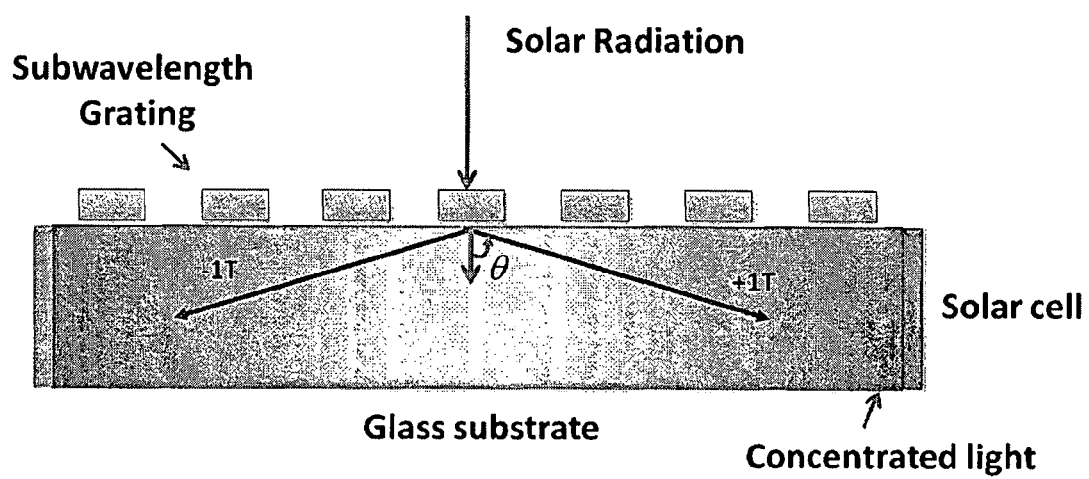
FIG. 6 shows the light concentrator for solar photovoltaic applications where in the solar cell placed at the edges converts light energy to electricity.
Figure 7:
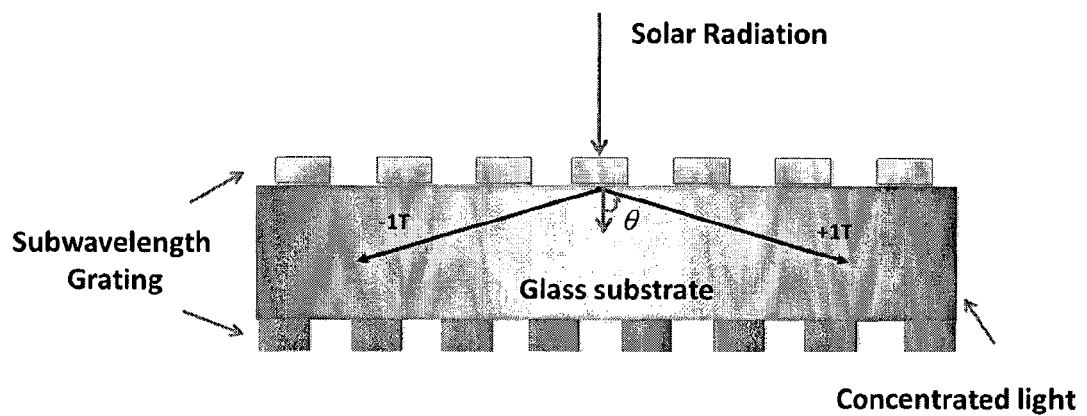
FIG. 7 shows the light concentrator with a sub-wavelength grating integrated on top and bottom of the glass substrate. The top grating is optimized for steep-angle diffraction of large wavelengths where as the bottom grating is optimized for steep angle diffraction of smaller wavelengths.
Figure 8:
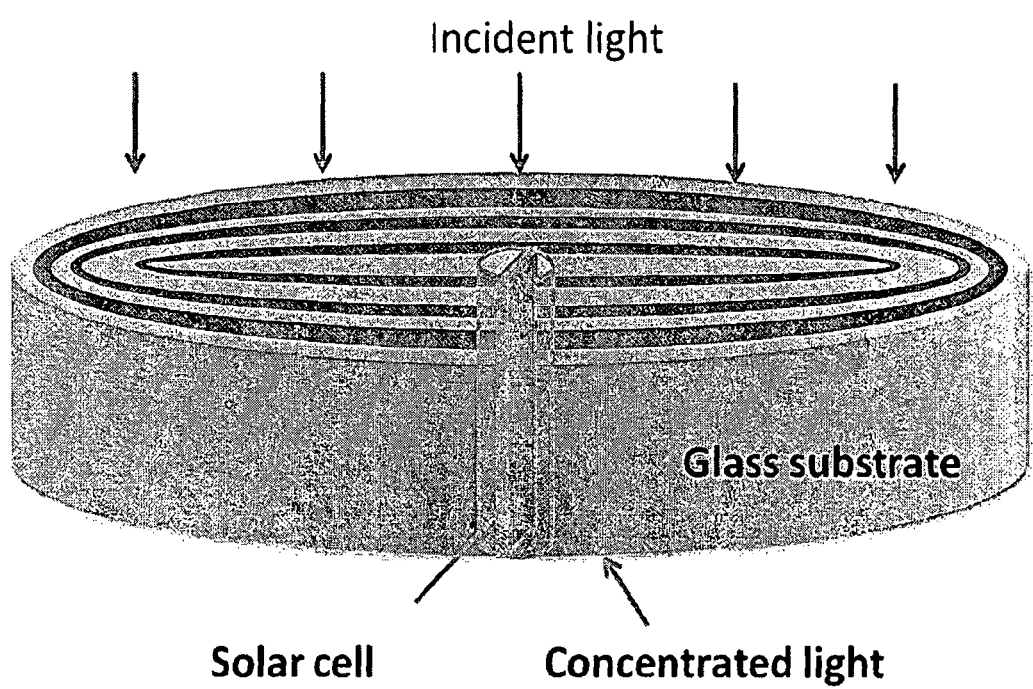
FIG. 8 shows the light concentrator with circular subwavelength grating integrated on top the glass substrate concentrates light towards the centre. A bi-facial solar cell converts the light energy to electricity.

An example of the light concentrator consists of the sub-wavelength diffraction grating with rectangular shape of thickness tg=0.18 μm, width w=0.27 μm, refractive index of the grating=3 and period Λ=0.67 μm. The grating material can be silicon derivatives (amorphous silicon/porous silicon or Nitrides (Gallium nitride, Aluminium nitride) or any other appropriately doped polymers) optimized to achieve a refractive index of 3. Since the grating is very thin (<μm), the material costs would be very low. The subwavelength grating is integrated on top of the glass substrate with refractive index 1.5 (glass substrate with refractive index ranging from 1.3 to 1.7 is workable for present invention) as shown in FIG. 6. These optimized parameter values enable efficient coupling of the incident light into the glass substrate where it is guided towards the edges reaching large concentration. A solar cell placed at the edges converts the sunlight to electricity.

Simulation Results

Example 2

Simulations are performed based on Rigorous Coupled Wave Analysis (RCWA) to find an optimized design wherein the incoming light incident normal to the grating is mainly diffracted into +1T and −1T modes.

FIG. 2 shows the contour plot of the energy diffracted into ±1T modes for a grating width of 0.27 μm and for various thickness values "$t_g$" of the grating. Refractive index of the grating is 3 and the glass substrate is 1.5. Period of the grating Λ is chosen to be 0.67 μm. The contour plot shows that it is possible to find an optimized design, $t_g$=0.18 um (i.e. $t_g/\Lambda=0.27$), wherein the incoming energy normal to the grating is mainly diffracted into ±1T modes with efficiency greater than 80% over a large wavelength range.

Example 3

Figure 3:
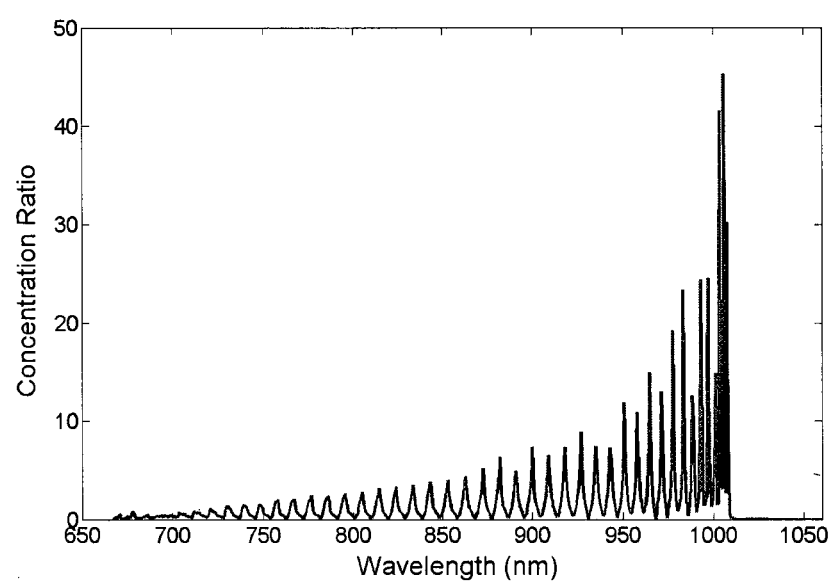
FIG. 3 shows the Concentration ratio as a function of wavelength obtained using finite difference time domain simulations. High concentration values approaching 50 times are obtained for large wavelengths.
Figure 4:
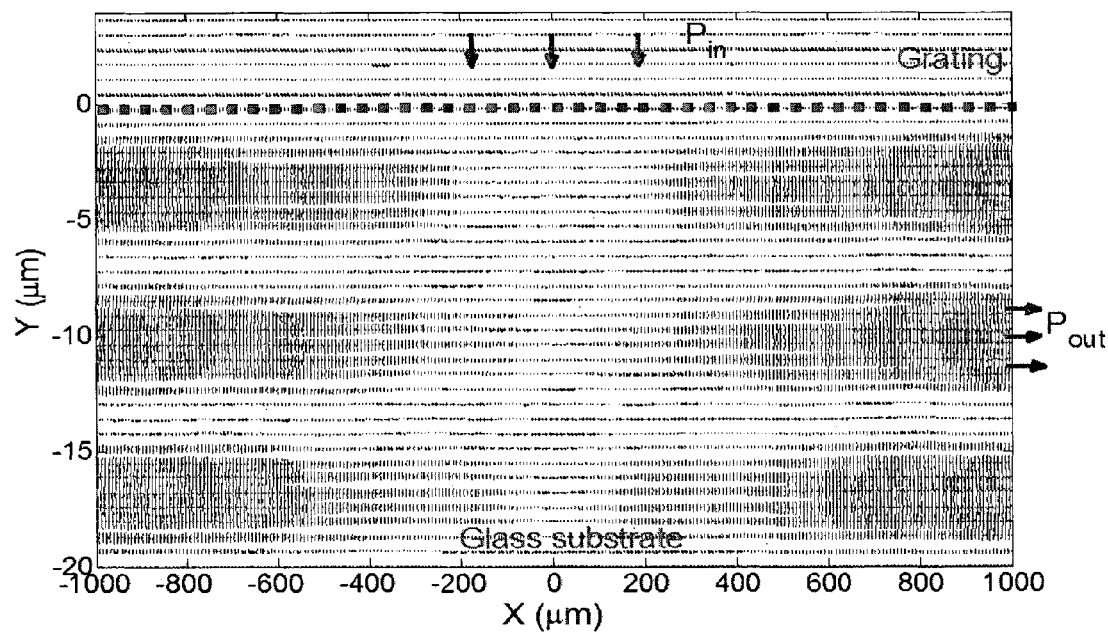
FIG. 4 shows the power flow in the glass substrate for a concentration ratio of 45 demonstrating large concentration of light at the edges.
Figure 5:
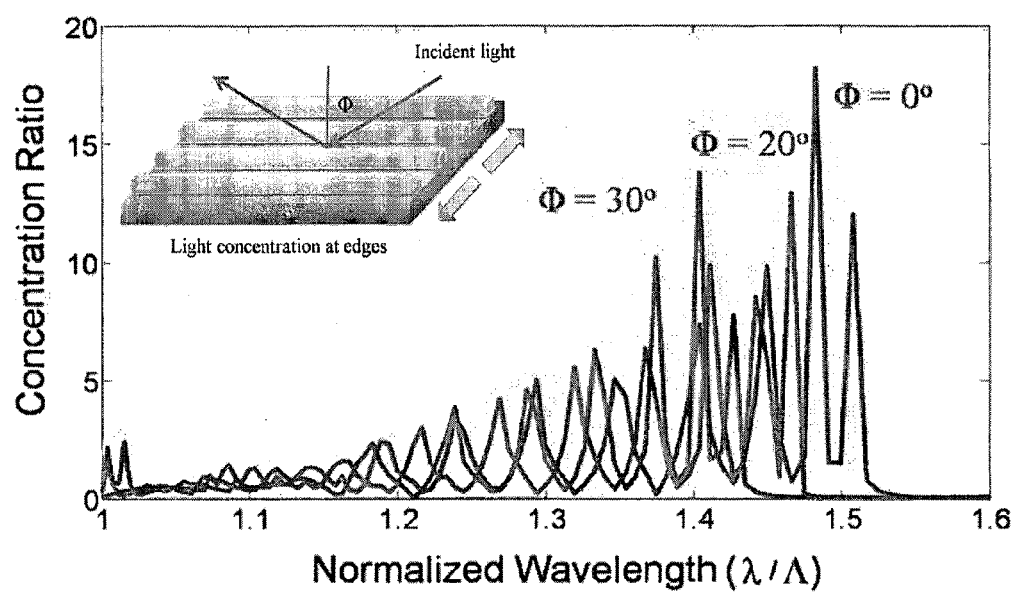
FIG. 5 shows concentration ratio for different light incident angles showing relatively large tolerance with respect to the variation of the incident angle.

Finite-Difference Time Domain (FDTD) simulations show that high concentration greater than 10 times can be achieved (FIG. 3) and that light can indeed be concentrated at the edges of the glass substrate (FIG. 4). Here, the inventors have simulated a concentrator with a size of 2 mm. These simulations are only for illustration purpose and concentrators with large dimensions can be easily simulated as the design is valid for any dimension of the concentrator.

Advantages of the Invention

The invention presents a novel planar design to realize light concentrators useful for many applications. The invention uses steep angle diffraction properties of sub-wavelength gratings to obtain large light concentrations in the glass substrates. Hence, compared to the traditional light concentrators using parabolic mirrors, lenses etc. the present planar design is less bulky and reduces the tracking, installations requirements of photovoltaic systems. Large light concentrations achieved here also translates to significant savings in the amount of high cost semiconductor needed for photovoltaic conversion and hence greatly helps in reducing the cost of solar photovoltaic energy. Further, long-wavelength IR light below the band gap of the solar cell which causes excessive heating can be completely eliminated in this approach (by optimally choosing the period of the grating) thereby active cooling requirements of the solar cell are significantly minimized. By controlling the grating profile, grating parameters (thickness, width values, refractive index etc.), and the light spectrum can be tuned for various solar photovoltaic applications.

I claim:

1. A method of concentrating light using a solar concentrator, said method comprising the steps of
   (i) providing subwavelength gratings on top and bottom surfaces of a planar substrate; and
   (ii) optimizing said subwavelength gratings for minimizing $0^{th}$ order reflection and transmission (0R, 0T) and maximizing the diffraction of the incoming light into higher transmission orders (+1T, −1T), wherein concentration of the subwavelength gratings is optimized according to formula:

$$C_{max}(\lambda) \approx \frac{2*r_d}{1-r_{dt}}\tan(\theta)$$

wherein, $C_{max}$ is concentration ratio,
$r_d$ is diffraction efficiency of incoming light into ±1T modes,
$r_{dt}$ is diffraction efficiency of +1T mode into −1T mode and vice versa,
$\theta$ is diffraction angle given by $\theta=\sin^{-1}(\lambda/\Lambda*n_{substrate})$ in the limit of large W/t where W is width of the solar concentrator, t is thickness of the solar concentrator, $\Lambda$ is period of the subwavelength gratings and $n_{substrate}$ is refractive index of the substrate.

2. The method as claimed in claim 1, wherein the subwavelength gratings are made on a glass substrate by a process selected from the group consisting of nano-imprint lithography, Interference lithography, Focused ion Beam (FIB) and E-beam lithography.

3. The method as claimed in claim 1, wherein the period ($\Lambda$) between two subwavelength gratings is in the range of 0.3 μm to 1.5 μm.

4. The method as claimed in claim 1, wherein a thickness of the subwavelength grating ($t_g$) is in the range of 0.1 μm to 5 μm.

5. The method as claimed in claim 1, wherein a width of the subwavelength grating (w) is in the range of 0.1 μm to 1.5 μm.

6. The method as claimed in claim 1, wherein the subwavelength grating is selected from the group consisting of rectangular, triangular and semi-circular profile projections.

7. The method as claimed in claim 1, wherein the refractive index of the subwavelength grating is in the range of 1.3 to 5.

8. The method as claimed in claim 1, wherein long wavelength IR light of wavelengths $\lambda/\Lambda>1.5$ are filtered from the incoming light, and wherein the period is optimally chosen to satisfy the above condition so that all the IR light below the band gap is filtered.

9. The method as claimed in claim 1, wherein the concentration of the incoming light is of order >10 times.

10. The method as claimed in claim 1, wherein the incoming light received within the planar substrate and diffracted by the subwavelength gratings is concentrated at edges of the planar substrate.

* * * * *